United States Patent [19]

Zollman et al.

[11] 4,232,345
[45] Nov. 4, 1980

[54] APPARATUS FOR PRODUCING A SEAMLESS COPY FROM AN UNJOINTED ORIGINAL

[75] Inventors: Peter M. Zollman, Walton-on-Thames; Keith G. Doyle, Sunbury-on-Thames, both of England

[73] Assignee: Zed Instruments Limited, Surrey, England

[21] Appl. No.: 967,841

[22] Filed: Dec. 8, 1978

Related U.S. Application Data

[63] Continuation-in-part of Ser. No. 928,410, Jul. 27, 1978, abandoned, which is a continuation of Ser. No. 805,980, Jun. 13, 1977, abandoned.

[30] Foreign Application Priority Data

Jun. 11, 1976 [GB] United Kingdom ............... 24350/76
Jun. 23, 1976 [GB] United Kingdom ............... 26126/76

[51] Int. Cl.³ ........................ H04N 1/22; H04N 1/26; H04N 1/38
[52] U.S. Cl. ..................................... 358/299; 358/283
[58] Field of Search ............................. 358/296–300, 358/302, 287, 283, 78, 256, 280

[56] References Cited

U.S. PATENT DOCUMENTS

| 3,272,918 | 9/1966 | Koll et al. | 358/287 |
|---|---|---|---|
| 3,541,245 | 11/1970 | Wilby | 358/280 |
| 3,636,251 | 1/1972 | Daly et al. | 358/297 |
| 3,760,098 | 9/1973 | de Voss et al. | 358/283 |
| 3,832,484 | 8/1974 | Tanaka | 358/256 |
| 3,944,726 | 3/1976 | Ito | 358/280 |
| 3,949,159 | 4/1976 | Ricards et al. | 358/297 |
| 3,956,583 | 5/1976 | Pugsley | 358/297 |
| 3,975,761 | 8/1976 | Taudt et al. | 358/78 |
| 4,001,495 | 1/1977 | Tauszig | 358/297 |
| 4,013,829 | 3/1977 | Baar et al. | 358/299 |
| 4,057,838 | 11/1977 | Doelves et al. | 358/299 |

FOREIGN PATENT DOCUMENTS

1283514 7/1972 United Kingdom .
1326775 8/1973 United Kingdom .

Primary Examiner—Raymond F. Cardillo, Jr.
Attorney, Agent, or Firm—Kerkam, Stowell, Kondracki & Clarke

[57] ABSTRACT

A copying system has an artwork carrier cylinder and a printing cylinder, and electronic control means "stretches" the copy to exactly 360° on the printing cylinder, to produce matched endless joints. The circumferential length of the original is first determined and then the original is scanned by a "read" scanner, the output of which is digitized and temporarily stored in memory. The contents of the memory are used to modulate a power laser during scanning to "write" on the printing cylinder but readout from the memory is adjusted in accordance with the circumferential length determined to produce the required jointing. The system may be varied to produce flexographic rollers, gravure cylinders or general copying.

17 Claims, 6 Drawing Figures

APPARATUS FOR PRODUCING A SEAMLESS COPY FROM AN UNJOINTED ORIGINAL

CROSS REFERENCE TO RELATED APPLICATIONS

This is a continuation-in-part of Application Ser. No. 928,410, filed July 27, 1978, and now abandoned, which is itself a continuation of Application Ser. No. 805,980, filed June 13, 1977, and now abandoned.

BACKGROUND OF THE INVENTION

1. Field of the Invention

The present invention concerns a copying system including a "read" scan of an original and a "write" scan utilising a laser beam modulated in accordance with the "read" scan. The invention is applicable to the production of flexographic rollers by laser engraving, or gravure cylinders by laser engraving or by a photoresist method, and to general copying.

2. Description of the Prior Art

It is known to engrave flexographic printing rollers by means of a laser beam, wherein a master roller carrying the original artwork is mounted coaxially with, and on the same drive shaft as, a printing roller which latter is covered with a special polymeric material that can be cut sharply by a laser beam without deleterious edge damage effects. The original artwork is transferred to the printing roller surface either by optical scanning or by a system employing a copper mask.

Optical scanning involves the use of a master roller and a printing roller of identical dimensions rotated together. A photoelectric scanning device provides an output from its scan of the artwork to pulse the laser. This method suffers from the disadvantages that either the rollers must be moved smoothly and continuously past the scanning device and the laser, or (where the rollers are particularly heavy) the device and the laser must be moved past the rollers. This mechanical arrangement results in an elongated, cumbersome apparatus requiring a great deal of space. Further, problems of inertia arise when starting or stopping the rotary and traversing movements of the relatively heavy objects involved. Also, it is difficult accurately to align adjacent pieces. Moreover, where geared drives are used, fluctuations in speed at tooth frequency inevitably arise. Finally, when it is desired to replace the rollers by rollers of different dimensions, the replacement procedure is cumbersome.

The mask system requires the preparation of a mask by a photo-etching technique resulting in a pattern of copper foil and plastics film unprotected by copper, to correspond to the original artwork. The mask is then placed on the printing roller. The copper reflects the laser beam while the plastics film is consumed and the beam can then attack the polymeric roller surface. This method has nearly all of the shortcomings of the optical scanning system mentioned above, and has the additional defect of involving the extra step and expense of requiring a mask to be in the first place; furthermore, the mask cannot be re-used.

The above-mentioned disadvantages of both methods are serious enough; however, perhaps their most important and common defect is that they require a great deal of expensive, time-consuming labour by skilled operators before a jointed printing surface that appears seamless (endless) can be produced from an unjointed artwork original.

SUMMARY OF THE PRESENT INVENTION

The present invention seeks to eliminate, or at least reduce, the above-mentioned disadvantages, and to provide a copying system in general, and in a particular application, a laser engraving process and apparatus for producing flexographic or gravure printing rollers which greatly simplifies the mechanical arrangement. In one of its broad aspects, the process and apparatus provide the automatic production of a jointed printing surface from an unjointed artwork original; while in another broad aspect, they open up the possibility of separating physically and in time by any desired amount the artwork scanning and copy-making, e.g. laser engraving, stages of the process by long-term storage of the information obtained from the scan in a convenient manner, e.g. magnetic tape storage.

In preferred embodiments representing refinements of the broad aspects, heavy lasers or cylinders need not be moved; a continuous printing cylinder can be produced from an unjointed master; a direct copying system is employed to obviate mask-making; the design information can be compressed so that repeats, mirror images and other derived "units" of the original artwork, obtained by a suitable transformation, need not be drawn out in full in the artwork; and great flexibility is afforded for the use of optional features by suitable and easily accomplished changes in the control electronics.

According to one aspect of the present invention there is provided a copying process for producing a seamless, jointed copy from an original, comprising mounting the original on a first rotary carrier with a circumferential gap between the ends of the original, scanning the original, modulating a power laser in accordance with the scan and directing the modulated laser beam towards a second rotary carrier to scan and engrave a laser-engravable surface of the second rotary-carrier, wherein the improvement comprises storing the data obtained in the scan in a store, reading data from the store to control modulation of the power laser, and controlling the store according to the length of the gap detected in scanning the original to ensure that each scan of the second carrier is filled by data from the original outside the gap.

According to another aspect of the present invention there is provided copying apparatus for producing a seamless copy from an unjointed original comprising a first rotary carrier for carrying an original and a second rotary carrier including a copy surface, a "read" scanning means movable relative to the first carrier for scanning the original on the first carrier; a laser; means for passing the information from the "read" scan to said laser to modulate the output of the laser, means for causing relative movement between the modulated laser output and the second carrier so as to perform a "write" scan to transfer a pattern derived from the "read" pattern to the copy surface, wherein the improvement resides in that the said means for passing information include a store for storing data obtained in scanning the original, means for measuring the circumferential length of the original when on the first carrier, and means for controlling the store in accordance with the output of the measuring means to ensure that each scan of the second carrier is filled by data from the original outside the said gap.

Although it is feasible to mount them on separate, discrete platforms, preferably the "read" and "write" scanning means are mounted on a common, displaceable platform while advantageously the "writing" laser, e.g. a $CO_2$ laser, is stationary and its modulated output is transmitted to the printing/copy surface via a "write" scanning head on the platform. In certain cases, however, the writing laser may be sufficiently light to be mounted directly on the platform and then the "write" scanner is constituted by the laser itself, in conjunction with optical means for focusing the laser beam.

Advantageously, the axes of movement of the carriers are parallel.

Preferably the "read" scanning means consists of optical elements, such as mirror(s) and/or prism(s) for directing a collimated beam at the artwork, preferably a laser beam from a stationary He-Ne laser, and of electro-optical transducer means for receiving the radiation reflected from the artwork and for transforming it into an electrical waveform representative of the optical density of the scanned artwork. However, in a modification the He-Ne laser may also be mounted on the platform and then the said optical elements may be obviated. Also, scanning need not be optical and any functionally equivalent mechanical, electro-mechanical or electrical scanning system may be used.

The apparatus may readily be provided with means for adjustment for variations in cylinder length or diameter, size of screen, drive speed etc.

The apparatus may consist of a first assembly which includes the first carrier, drive means for the first carrier, the "read" scanning means, the said store, and means for storing processed signals from the store in a long-term (permanent) store; and a second assembly which includes the "writing" laser, means for reading out information from said long-term store and passing said signals to the laser to modulate its output, the "write" scanning means and associated drive means, the second carrier, and second drive means for the second carrier; the said assemblies being physically separatable from each other to mutually remote locations.

BRIEF DESCRIPTION OF THE DRAWINGS

A preferred embodiment of the invention will now be described with reference to the accompanying purely schematic drawings wherein:

FIG. 5b is a waveform generated in scanning the surface portion of FIG. 5a.

DESCRIPTION OF THE PREFERRED EMBODIMENTS

Figure 1:
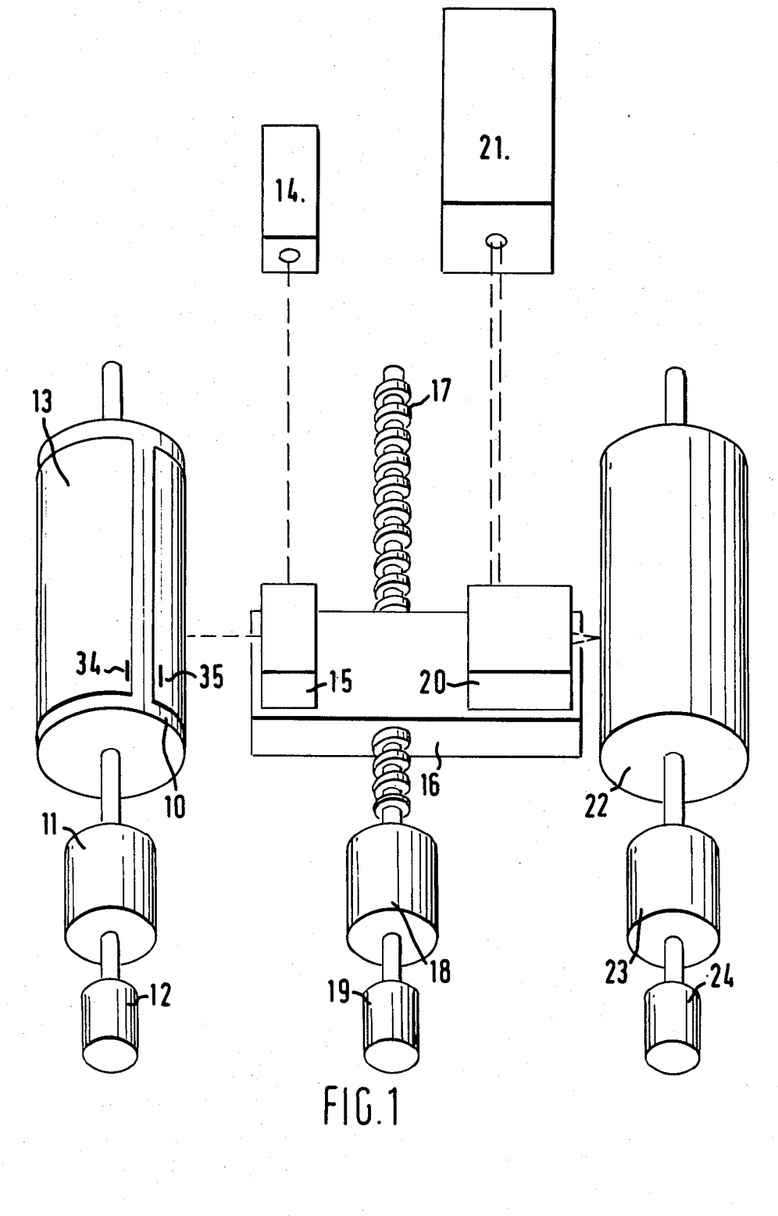
FIG. 1 is a schematic layout of the mechanical elements of the apparatus.

In FIG. 1 a master roller 10 is adapted to be rotated by a drive means 11 and a resolver 12 is provided to give information about the instantaneous position of the roller 10. An unjoined artwork 13 is mounted on the roller with its leading and trailing edges circumferentially spaced, as shown.

The artwork 13 is scanned by a He-Ne laser 14 via a scanning head 15 mounted on a platform 16 which is intermittently advanced in very small steps on a lead screw 17 by a stepper motor 18. A resolver 19 is associated with the stepper motor to provide information about the instantaneous position of the platform.

The platform 16 also carries a "writing" head 20 receiving the pulsed beam of a power ($CO_2$) laser 21 and passes this beam to the printing surface of a printing cylinder 22 which has a diameter smaller than that of the master cylinder 10. Thus artwork which is to be reproduced on a nominal 1:1 scale can be wrapped around the cylinder 10 leaving a gap. The axes of the cylinders 10, 22 are parallel. The cylinder 22 is rotated in use by drive means 23 and information as to its instantaneous position is provided by a resolver 24.

Figure 2:
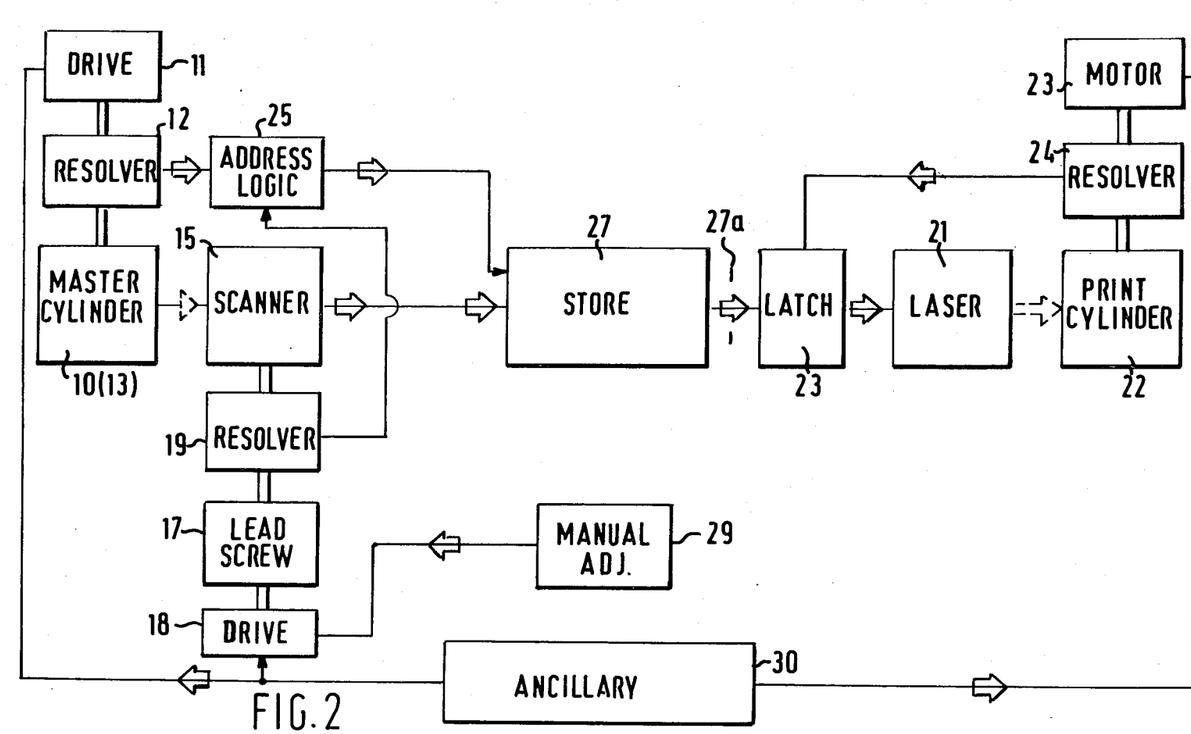
FIG. 2 is an information diagram in modular form.

The diagram of FIG. 2 shows the apparatus in modular-schematic form. A single full line with solid arrow represents an electrical connection; the single broken line and arrow represent the "read" or He-Ne laser; the double broken line and arrow represent the "write" or $CO_2$ power laser; and the double solid lines represent a mechanical connection. A block 25 represents logic controlling the addressing of a random access memory 27, and has inputs connected to the master roller resolver 12 and to scanner resolver 19. The memory 27 stores a single-line at a time, and addressing relates to angular measurement in the plane of scanning so that the difference in diameters of the cylinders 10 and 22 is irrelevant to the addresses stored. This store is to be distinguished from the optional large-scale, permanent store, e.g. tape store, referred to above. The dotted vertical line 27a between the single-line store 27 and a latch circuit 28 in FIG. 2 indicates schematically the preferred location of the physical separation of the first and second assemblies, as referred to above.

While the modules 25, 27, 28 and 32 are explained below with reference to FIG. 3, it is mentioned briefly that module 29 represents a facility for manual adjustment of the stepper motor drive 18 according to screen size, and module 30 is representative of a variety of ancillary units such as power supplies, manual inputs, main motor control, synchronisation of the roller drives, safety devices (e.g. to prevent laser operation when the drive is OFF or when there is no artwork present on roller 10) and fume/vapour extracting devices.

The address logic 25 is shown in more detail in FIG. 3 together with the scanner 15, comparator logic 32 which is explained below, the store 27 and the latch circuit 28 the function of which is to switch the laser 21 on and off as required.

The address logic carries out the function of automatic jointing by writing a single circumferential line of data from the scanner 15 into the random access memory 27 and reading it out again to control the operation of the writing laser 21 in such a way that data scanned during any joining gap in the artwork 13 is omitted and the stored data is stretched to occupy a complete revolution of the roller 22 on read-out from the memory. The address logic will now be described for an embodiment of the invention in which shortly after each point (except in the gap) is scanned in a circumferential scan of the artwork 13, a corresponding engraving operation is carried out in a concurrent circumferential engraving operation on the printing cylinder 22.

The gap in the artwork is indicated by means of two register marks 34 and 35 shown in FIG. 1. While the rollers 10 and 22 rotate but before engraving begins, the operator positions the scanner over these marks and operates a "set jointing factor" control of initialising logic 36. A reset pulse is applied to an artwork-length counter 37, a write-address counter 38 and a read-address counter 39. The initialising logic 36 also applies an enable signal to the artwork-length counter 37, enabling the counter 37 to count clock pulses from a clock pulse generator 41 during the interval between the "start" register mark 34 and the "finish" register mark 35. Thus one revolution after the "set jointing factor" control has been operated, the artwork-length counter 37 contains a number proportional to the length of the artwork, and this number remains constant while the artwork 13 is completely scanned.

The frequency of pulses from the clock pulse generator 41 is divided down and used to supply the drive means 11 and 23 which may be either stepper motors or digital servos so that both the cylinders 10 and 22 turn through one revolution within a precise number of clock pulse periods. The clock pulse generator is also synchronised with resolvers 12 and 19 and generates a series of "write" signals on a line 42. The "write" signals allow the random access memory 27 to perform four internal cycles (one read cycle, a zero cycle when no external operations are carried out, and one or two write cycles) for every clock pulse depending on the jointing to be carried out. In each write cycle the random access memory 27 is in a "read" condition and stores information from the scanner 15 by way of the logic 32. "Read" signals are generated by an inverter 43 coupled to the line 42, and cause data to be read out and used to modulate the laser 21.

An address selector 44 selects addresses for the memory 27 either from the write-address counter 38 or, when a signal is applied to the selector from the inverter 43, from the read address counter 39.

In a "write" cycle, the address selector takes an address for the memory 27 from the write-address counter 38 which is incremented by clock pulses as scanning progresses and data from one point in the scan is stored. However, if a gap is to be filled no data is to be written while the gap is scanned and this is achieved by providing write operations additional to those initiated by clock pulses so that zero data are stored at the addresses provided during the additional "write" operations. These additional "write" operations are described below after a description of the "read" cycle.

When after a "write" cycle, a "read" cycle for the memory 27 is initiated following a clock pulse by signals from the invertor 43, the address selector 44 selects addresses from the read-address counter 39. Clock pulses increment this counter (at the same time as the counter 38) steadily at a rate which causes all the data from the memory to be read out by way of the latch circuit 28 to the write laser 21 in one revolution of the cylinder 22 stretching the data and filling the gap. However, it will be appreciated that the "read" cycles closely follow "write" cycles so that data items are read out shortly after having been written. The latch circuit 28 is controlled by pulses from the resolver 24 so that data is only read out at the end of a "read" cycle.

When the read-address counter 39 reaches its maximum value it overflows and returns to zero, and at the same time resets the write-address counter 38, allowing a new cycle of read operations to commence.

Additional write operations are initiated by a comparator 46 which compares the value held in the write-address counter with that in the artwork-length counter. If the latter is greater or equal to the former an additional write pulse is generated which is applied to the memory 27 by way of an OR gate 47 and an AND gate 48. Each additional write pulse is also passed back to increase the content of the write address counter by one until the counter overflows when further write pulses are prevented from reaching the memory 27 or the counter 38 by an inverter 49 which closes the AND gate 48. Thus the write address counter reaches its maximum content at the beginning of the gap and further write operations for the memory 27 are prevented.

For example, if the number of clock pulses per revolution is $2^{16} = 65536$ and the artwork-length counter 37 contains the number 64536, then 1000 additional write pulses will be generated.

If the output of the write address counter were coupled conventionally to the comparator 46, all the additional write pulses would occur at the end of a scan and only the data at the scan end would be stretched to cover the gap. In order therefore to stretch the artwork in a more uniform way additional write pulses are made to occur with a more even spacing. For this reason the connections from the write address counter 38 to the comparator 46 are reversed with the result that the most significant counter bit is applied to the least significant comparator input and vice versa.

The effect is illustrated as follows: If the artwork length is equivalent to 65532 clock pulses (that is 1111111111111100) this number is only equal to or exceeded by:
 1111111111111100
 1111111111111101
 1111111111111110
 1111111111111111
and the reversed numbers giving the above numbers are
 0011111111111111=16383
 1011111111111111=49151
 0111111111111111=32767
 1111111111111111=65535

Hence one additional write pulse occurs when each of the last four binary numbers given above occur. The number of pulses is unchanged since the write address counter cycles through all its possible states. This scheme may be extended to non binary systems provided that the input to the comparator 46 from the counter 38 cycles through all valid numbers from zero to maximum.

Figure 3:
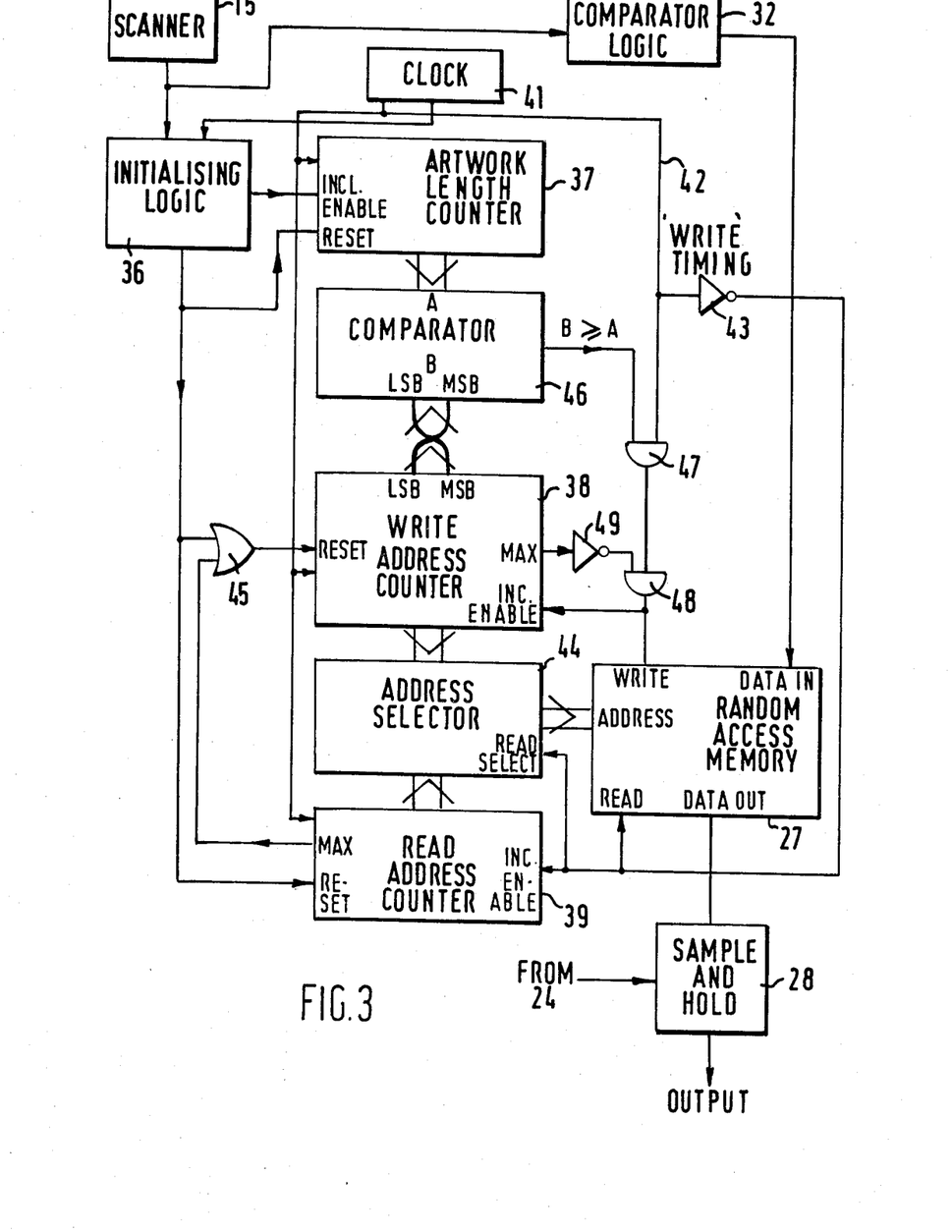
FIGS. 3 and 4 are block diagrams of parts of the apparatus.
Figure 4:
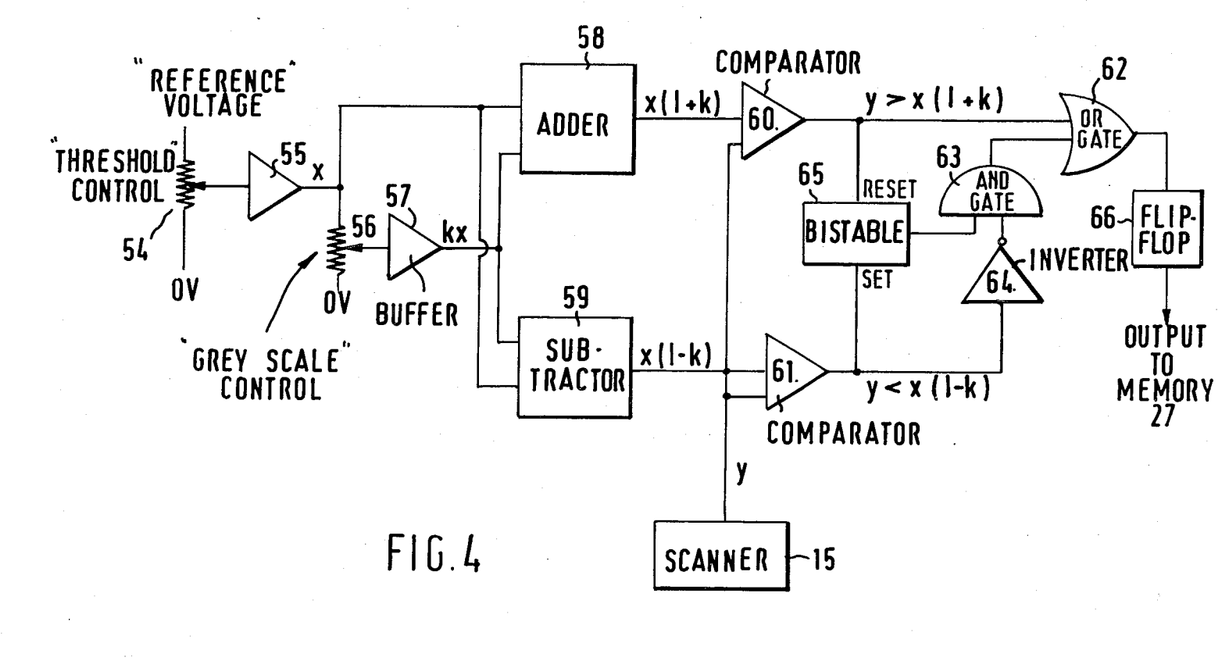
Figure 5A:
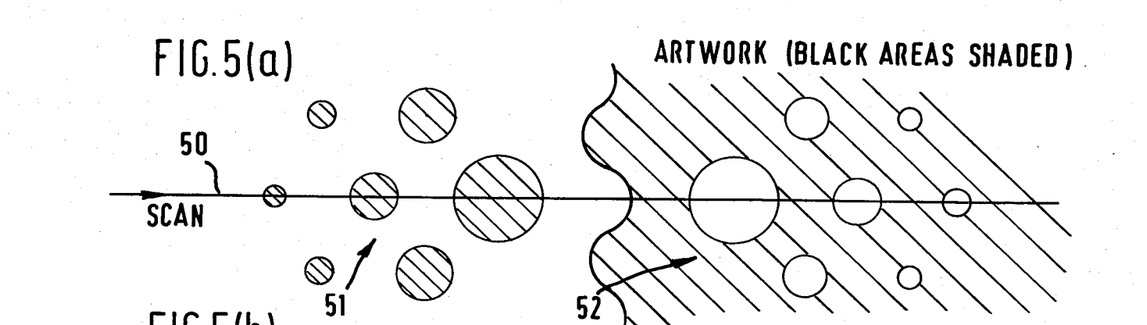
FIG. 5a shows a portion of a surface of artwork.
Figure 5B:
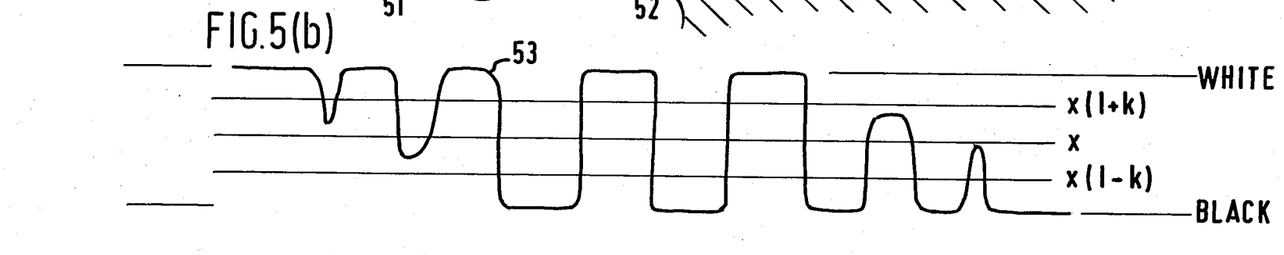

The comparator logic 32 of FIG. 3 is shown in more detail in FIG. 4. Due to limitations in the size of light spot produced by the scanning laser 14 and the quality of the artwork, the signal from the scanner 15 when a small mark occurs on the artwork may not reach the levels associated with large areas of black or white. This effect is shown in FIG. 5(a), where a scan 50 passes over a white area 51 with black marks and then a black area 52 with white marks, and FIG. 5(b) where the resulting scanner output waveform 53 is shown.

If a single threshold level x is used to distinguish black from white, no value for x can be found which ensures that small black and white areas will be reproduced. For this reason two levels are used, equal to $x(1+k)$ and $x(1-k)$, as is now explained.

The levels are generated by the circuit of FIG. 4 where a potentiometer 54 is used to set the level x at the output of a buffer amplifier 55. A proportion k of x is selected using a "grey-scale" potentiometer 56 and passed by way of a buffer amplifier 57 to an adder 58 and a subtractor 59 which also receive the voltage x. Thus reference levels $x(1+k)$ and $x(1-k)$ are provided for comparators 60 and 61, respectively, to which the output y of the scanner 15 is applied.

If $y > x(1+k)$, the output of the comparator 60 is high as is the output of an OR gate 62 which is coupled to the random access memory 27 by way of a D type flip-flop 66. If $y < x(1-k)$, an AND gate 63 and an inverter 64 set the output of the OR gate 62 low. When $x(1-k) < y < x(1+k)$, a bistable 65 determines the output of the OR gate 62 according to whether this "grey" band was entered from above or below. If it was entered from above (that is from a white region) the bistable is reset and the OR gate output is low, and conversely if it was entered from below, the OR gate output is set high.

The flip-flop 66 which is clocked by the generator 41 of FIG. 3 holds the output signal from the OR gate 62 steady except during clock pulses.

The drive may be co-ordinated so that for each revolution of the carrier (10) and printing (22) cylinders the stepper motor 18 drives the platform 16 by one step and a full circular line is engraved for each such revolution; alternatively, however, it could be arranged that two or more complete cylinder revolutions perform the engraving of one complete circumferential line while the platform is caused to move axially by an increment which is smaller than the axial step associated with the normal "read" scan, whereby to improve the "write" resolution of the system; during an additional revolution, then, the platform 16 is stepped for a subsequent scan.

Means may be provided for the initial alignment of the system with the "reading" scanning beam, and for the rapid detection and display of misalignment between the leading and trailing edges of the joint, e.g. register marks.

What is claimed is:

1. Copying apparatus for producing a seamless copy from an unjointed original having leading and trailing edges separated by a gap, said apparatus comprising: a first rotary carrier for carrying an original and a second rotary carrier including a copy surface; a "read" scanning means movable relative to the first carrier for scanning the original on the first carrier; a laser; means for passing the information from the "read" scan to said laser to modulate the output of the laser; means for causing relative movement between the modulated laser output and the second carrier so as to perform a "write" scan to transfer a pattern derived from the "read" pattern to the copy surface; said means for passing information including a store for storing data obtained in scanning the original; means for measuring the circumferential length of the original when on the first carrier; and store-controlling means connected to the output of the measuring means and effective to control the store in accordance with the measuring means output to ensure that each scan of the second carrier is filled by data from the original outside the gap.

2. Apparatus according to claim 1 including respective drive means for the carriers wherein the drive means are mechanically independent and unconnected, there being electronic means for controlling the synchronisation of the said drive means.

3. Apparatus according to claim 1 wherein means are provided for variably controlling the time relationship between the associated "read" and "write" scans.

4. Apparatus according to claim 1 wherein the "read" scanning means consists of optical elements for directing a collimated beam from a remote source at the original, and of electro-optical transducer means for receiving the radiation reflected from the original and for transforming the reflected radiation into an electrical waveform representative of the optical density of the scanned original.

5. Apparatus according to claim 1 wherein the apparatus consists of a first assembly which includes the first carrier, drive means for the first carrier, the "read" scanning means, the said store, and means for storing processed signals from the store in a long-term (permanent) store; and a second assembly which includes the "writing" laser, means for reading out information from said long-term store and passing said signals to the laser to modulate its output, the "write" scanning means and associated drive means, the second carrier, and second drive means for the second carrier; the said assemblies being physically separatable from each other to mutually remote locations.

6. Apparatus according to claim 1 wherein the first carrier is a cylinder and the copy carrier is a printing cylinder, the cylinders being of unequal diameter.

7. Copying apparatus according to claim 1 wherein the original has a register mark applied adjacent each of said edges for scanning by said "read" scanning means.

8. Copying apparatus according to claim 1 wherein the means for passing information includes comparator logic having a binary output signal, dependent on the magnitude of the signal from the scanning means, for modulating the output of the laser to cause light to reach the second carrier in one binary state and to prevent light reaching the second carrier in the other binary state.

9. Copying apparatus according to claim 8 wherein the comparator logic is constructed to generate an output signal in the first binary state if either $Y > x(1+k)$, or $x(1-K) < y < x(1+k)$ provided immediately before y was greater than $x(1+k)$, where y represents the magnitude of the output signal of the scanning means, x represents a predetermined threshold level and k is a predetermined constant, the logic means being constructed to generate an output signal in the second binary state if either $y < x(1-k)$, or $x(1-k) < y < x(1+k)$ provided immediately before y was less than $x(1-k)$.

10. Apparatus according to claim 1 wherein a common, displaceable platform is provided to carry said "read" and "write" scanning means.

11. Apparatus according to claim 10 wherein the laser is stationary and its modulated output is transmitted to the printing/copy surface via a "write" scanning head mounted on the platform.

12. Copying apparatus according to claim 1 wherein the store is a random access memory and the means for controlling the store comprise a write-address counter and a read-address counter both coupled to be incremented by pulses from a clock-pulse generator during scanning, and an address selector coupled to select the content of the write-address counter to provide addresses for the random access memory for data obtained by scanning the original and to select the content of the read-address counter for reading out data from the random access memory to modulate the laser for write scanning of the second carrier.

13. Copying apparatus according to claim 12 wherein the means for measuring the circumferential length of the original includes an artwork counter for storing a count representing the said circumferential length, and means for controlling the store includes a comparator for comparing the output of the artwork counter with the content of the write-address counter, the clock-pulse generator being coupled to the store to initiate store-write operations and store-read operations during scanning, and the comparator initiating an additional store-write operation which also increases the content of the write-address counter each time the content of the write-address counter bears a predetermined relationship with the content of the artwork counter.

14. Copying apparatus according to claim 13 wherein the comparator has a plurality of input terminals corresponding to the significance of input signals to be applied thereto, the write-address counter has a plurality of output terminals corresponding to the significance of output signals to be derived therefrom, and the most and second most significant output terminals of the write-address counter are connected to the least and second least significant input terminals of the comparator, respectively, and so on in sequence with the least significant output terminal of the write-address counter connected to the most significant input terminal of the comparator.

15. Copying apparatus for producing a seamless copy from an unjointed original having leading and trailing edges separated by a gap, said apparatus comprising: a first rotary carrier for carrying an original and a second rotary carrier including a copy surface; a "read" scanning means movable relative to the first carrier for scanning the original on the first carrier; a laser; means for passing the information from the "read" scan to said laser to modulate the output of the laser; means for causing relative movement between the modulated laser output and the second carrier so as to perform a "write" scan to transfer a pattern derived from the "read" pattern to the copy surface; said means for passing information including a random-access memory (RAM) store for storing data obtained in scanning the original; measuring means for measuring the circumferential length of the original when on the first carrier store; control means for controlling said RAM store in accordance with the output of the measuring means to ensure that each scan of the second carrier is filled by data from the original outside the said gap; said measuring means including an artwork counter for storing a count representing the circumferential length; and said RAM store control including a write-address counter and a comparator for comparing the output of the artwork counter with the content of the write-address counter, a clock-pulse generator being coupled to said RAM store to initiate store-write operations and store-read operations during scanning, and the comparator initiating an additional store-write operation which also increases the content of the write-address counter each time the content of the write-address counter bears a predetermined relationship with the content of the artwork counter.

16. Copying apparatus according to claim 15 wherein the comparator has a plurality of input terminals corresponding to the significance of input signals to be applied thereto, the write-address counter has a plurality of output terminals corresponding to the significance of output signals to be derived therefrom, and the most and second most significant output terminals of the write-address counter are connected to the least and second least significant input terminals of the comparator, respectively, and so on in sequence with the least significant output terminal of the write-address counter connected to the most significant input terminal of the comparator.

17. Copying apparatus for producing a seamless copy from an unjointed original having leading and trailing edges separated by a gap, said apparatus comprising: a first rotary carrier for carrying an original and a second rotary carrier including a copy surface; a "read" scanning means movable relative to the first carrier for scanning the original on the first carrier; a laser; means for passing the information from the "read" scan to said laser to modulate the output of the laser; means for causing relative movement between the modulated laser output and the second carrier so as to perform a "write" scan to transfer a pattern derived from the "read" pattern to the copy surface; said means for passing information including a store for storing data obtained in scanning the original; means for measuring the circumferential length of the original when on the first carrier; and store-controlling means connected to the output of the measuring means and effective to control the store in accordance with the measuring means output to ensure that each scan of the second carrier is filled by data from the original outside the gap; said means for passing information further including comparator logic having a binary output signal, dependent on the magnitude of the signal from the scanning means, for modulating the output of the laser to cause light to reach the second carrier in one binary state and to prevent light reaching the second carrier in the other binary state, and wherein the comparator logic is constructed to generate an output signal in the first binary state if either $y > x(1+k)$, or $x(1-k) < y < x(1+k)$ provided immediately before y was greater than $x(1+k)$, where y represents the magnitude of the output signal of the scanning means, x represents a predetermined threshold level and k is a predetermined constant, the logic means being constructed to generate an output signal in the second binary state if either $y < x(1-k)$, or $x(1-k) < y < x(1+k)$ provided immediately before y was less than $x(1-k)$.

* * * * *